United States Patent [19]
Chung et al.

[11] Patent Number: 6,166,957
[45] Date of Patent: Dec. 26, 2000

[54] NONVOLATILE SEMICONDUCTOR MEMORY DEVICE WITH A LEVEL SHIFTER CIRCUIT

[75] Inventors: Hwi-Taek Chung, Kyunggi-do; Jong-Min Park, Suwon, both of Rep. of Korea

[73] Assignee: Samsung Electronics Co., Ltd., Suwon, Rep. of Korea

[21] Appl. No.: 09/465,792

[22] Filed: Dec. 17, 1999

Related U.S. Application Data

[62] Division of application No. 09/167,534, Oct. 7, 1998, Pat. No. 6,101,126.

[30] Foreign Application Priority Data

Oct. 8, 1997 [KR] Rep. of Korea ................ 97-51632

[51] Int. Cl.[7] .................................................. G11C 16/06
[52] U.S. Cl. ............................. 365/185.23; 365/189.11; 365/230.06
[58] Field of Search ..................... 365/230.06, 189.11, 365/189.09, 196, 185.23; 327/291

[56] References Cited

U.S. PATENT DOCUMENTS

5,822,253  10/1998  Lines ................................ 365/189.11

*Primary Examiner*—Vu A. Le
*Attorney, Agent, or Firm*—Jones Volentine, LLC

[57] ABSTRACT

A nonvolatile semiconductor device which includes a word line, a bit line, and a memory cell connected to the word line and the bit line, also has a word line driving circuit for driving the word line with a word line voltage supplied in response to a shut off signal in accordance with each mode of operation, and a circuit for generating the shut off signal during each mode of operation. The circuit generates the shut off signal which has a power supply voltage when the word line voltage is higher than the power supply voltage, and has the word line voltage when the word line voltage is less than the power supply voltage.

8 Claims, 5 Drawing Sheets

NONVOLATILE SEMICONDUCTOR MEMORY DEVICE WITH A LEVEL SHIFTER CIRCUIT

This application is a divisional application of "NONVOLATILE SEMICONDUCTOR MEMORY DEVICE WITH A LEVEL SHIFTER CIRCUIT," by Hwi-Taek Chung, et al., Ser. No. 09/167,534, filed on Oct. 7, 1998, now U.S. Pat. No. 6,101,126 the contents of which are herein incorporated by reference in its entirety.

BACKGROUND OF THE INVENTION

The present invention relates to a nonvolatile semiconductor memory device and, more particularly to a nonvolatile semiconductor memory device having a word line driver (or a level shifter) which can transfer into a word line a voltage both higher and lower than a power supply voltage.

Memory circuits are well known, and include an array of memory cells, each apable of storing a bit of information. In order to appropriately access a desired word of information, comprising a plurality of bits, appropriate row decoder circuits are used which select appropriate row lines (or word lines) for access. Similarly, column accessing circuitry is often employed to select an appropriate number of bits within the row for output.

Figure 1:
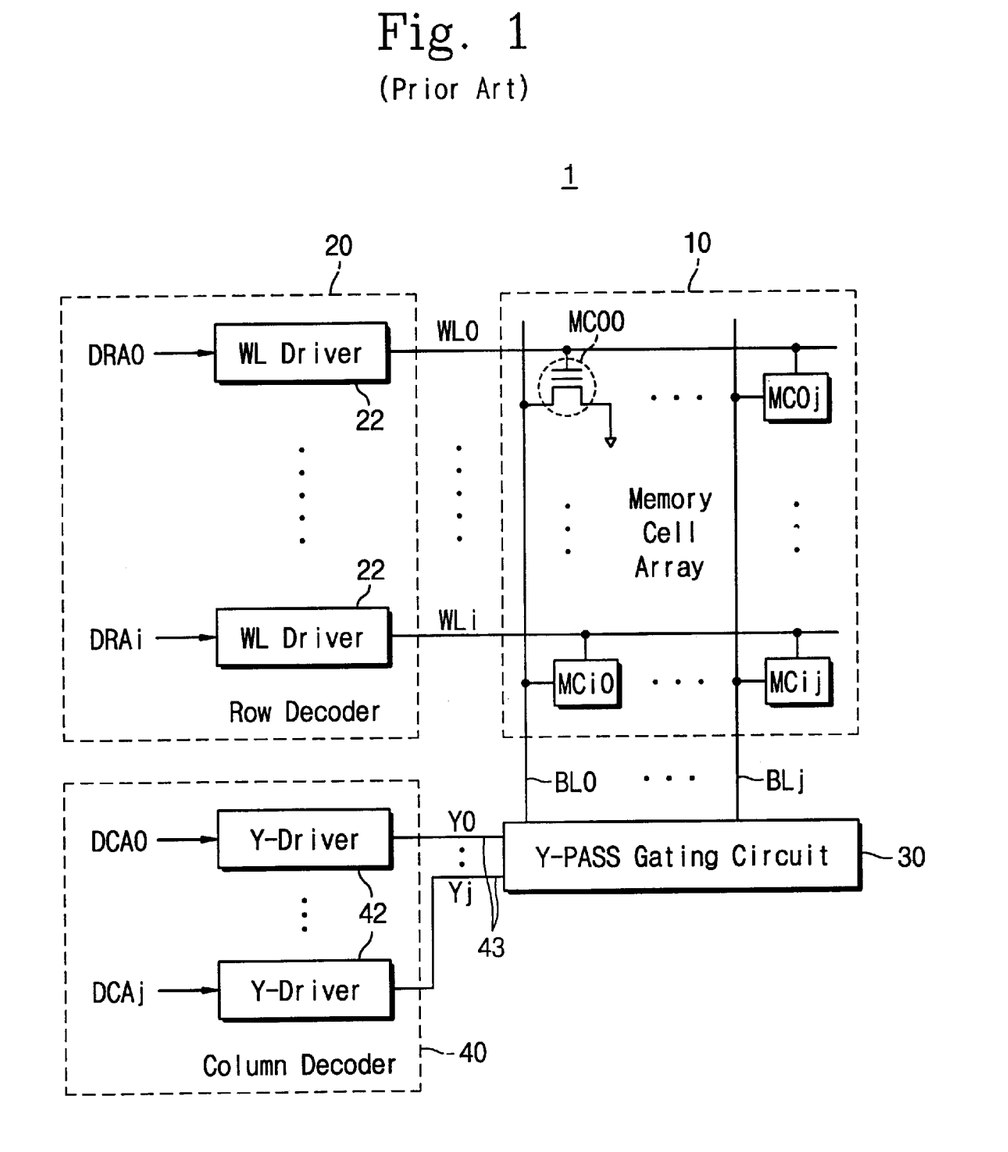
FIG. 1 shows a block diagram of a nonvolatile semiconductor memory device according to the prior art.

FIG. 1 is a block diagram of a nonvolatile semiconductor memory device according to the prior art. In FIG. 1, the nonvolatile semiconductor memory device 1 consists of a memory cell array 10 having a plurality of memory cells MCxy (x=0, 1, 2, . . . , i and y=0, 1, 2, . . . , j), a plurality of word lines WLx, and a plurality of bit lines BLy. Each of the memory cells MCxy is an electrically erasable and programmable read only memory ("EEPROM") cell (or flash EEPROM cell) or an electrically programmable read only memory ("EPROM") cell, and has a control gate, a floating gate, a source, and a drain. Their control gates are coupled respectively to corresponding word lines WLx, their drains are tied to corresponding bit lines BLy, and their sources are grounded. The nonvolatile semiconductor memory device of such a memory cell arrangement structure is often referred to as "NOR structured flash memory device".

As illustrated in FIG. 1, the nonvolatile semiconductor memory device 1 further comprises a row decoder circuit 20, which selects one of the word lines WLx and drives the selected word line with a word line voltage Vpp (for example, reading, programming, erasing, or verification voltage) required at each mode of operation. The row decoder circuit 20 has a plurality of word line drivers 22 each connected to corresponding word lines WLx. Each of the word line drivers 22 drives a corresponding word line WLx with the word line voltage Vpp in response to a corresponding selection signal (DRAx), for example, a signal decoded by a row address decoding circuit (not shown). One of the bit lines BLy is selected by a column pass gating circuit 30, which, for example, consists of switching transistors (not shown) switched on/off by corresponding column selection signals Y0–Yj, respectively. A column decoder circuit 40 selects one of lines 43 to transfer corresponding column selection signals Y0–Yj, and has a plurality of column drivers 42. Each of the column drivers 42 drives the corresponding line 43 with a voltage required for each mode of operation.

Figure 2:
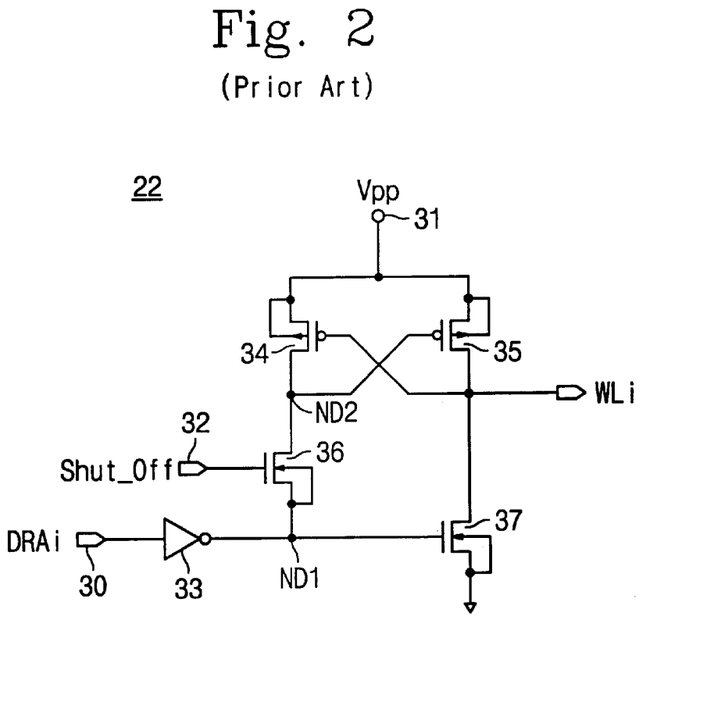
FIG. 2 shows a detailed circuit diagram of a first prior art word line driver as shown in FIG. 1.

Referring to FIG. 2, a detailed circuit diagram of a word line driver 22 connected to one word line (for example, WL0) according to the first prior art is illustrated, but those of other word line drivers 22 connected respectively to word lines (for example, WL1–WLi) are the same as that of the word line driver 22. The word line driver 22 has three input nodes 30, 31, and 32 receiving a selection signal DRAi, a word line voltage Vpp, and a shut off signal Shut_Off, respectively. The word line driver 22 consists of an invertor 33, two PMOS transistors 34 and 35, and two NMOS transistors 36 and 37 connected as shown in FIG. 2.

The operation of the word line driver 22 associated with program and read modes of operation will be described below.

First, a read operation for a selected memory cell MC00 is described. During the read operation, a word line voltage Vpp of about +4.5 volts is applied to the word line WL0 connected to the word line driver 22, and a bit line voltage of about +1 volts is supplied to a bit line BL0 connected to the selected memory cell MC00. At this time, the selection signal DRA0 becomes a 'H' level (for example, the level has a power supply voltage Vcc level) and the shut off signal Shut_Off has the 'H' level. Under this condition, a node ND1 becomes a 'L' level (for example, a ground voltage level) through the invertor 33, and a node ND2 has the 'L' level through the NMOS transistor 36 switched on by the shut off signal Shut_Off. This turns off the NMOS transistor 37 and turns on the PMOS transistor 35, so that the word line WL0 is pulled up to the word line voltage Vpp of about +4.5 volts through the PMOS transistor 35 thus turned on.

During the program operation, the word line voltage Vpp of about +10 volts is applied to the word line WL0 and a bit line voltage of about +5 volts is supplied to the bit line BL0. At this time, the selection signal DRA0 and the shut off signal Shut_Off both are at the 'H' level. Under this condition, the node ND1 becomes the 'L' level through the invertor 33, and the node ND2 has the 'L' level through the NMOS transistor 36 switched on by the shut off signal Shut_Off. This turns off the NMOS transistor 37 and turns on the PMOS transistor 35, so that the word line WL0 is pulled up to the word line voltage Vpp of about +10 volts through the PMOS transistor 35.

As is well-known in the art, the program/erase mode of operation is performed, and then a verification operation for the program/erase mode of operation is performed to detect whether a selected memory cell is programmed at a required threshold voltage (for example, 6–8 volts) or is erased at a required threshold voltage (for example, 1–3 volts). In general, in a nonvolatile semiconductor memory device having NOR structured flash memories, an over-erasure verification voltage applied to a word line is about +1 volts and an erasure verification voltage applied thereto is about +3 volts.

During an over-erasure verification operation in which a voltage Vpp of about +1 volts is applied to a selected word line (for example, WL0), a selection signal DRA0 and the shut off signal Shut_Off are both at the 'H' level. This turns on the PMOS transistor 35 through the NMOS transistor 36, switched on by the shut off signal Shut_Off, and turns off the NMOS transistor 37, so that the word line WL0 is pulled up to the voltage of about +1 volt.

Simultaneously, a ground voltage is applied to deselected word lines WL1–WLi, and selection signals DRA1–DRAi associated with the deselected word lines WL1–WLi are at the 'L' level. Under this condition, the node ND1 has the 'H' level and the NMOS transistor 37 is turned on. This forces each deselected word line WL1–WLi to be grounded, and then the PMOS transistor 34 in each driver 22 is turned on. The node ND2 is pulled up to the voltage Vpp of about +1 volts through the PMOS transistor 34. As a result, the nodes ND1 and ND2 are shorted through the NMOS transistor 36, turned on by the shut off signal having the 'H' level, enabling the word line voltage Vpp applied to the selected word line WL0 to be raised in voltage toward Vcc. That is, one problem in the prior art is that the word line driver 22 in FIG. 2 does not transfer the word line voltage Vpp into the corresponding word line when the word line voltage Vpp is less than a power supply voltage Vcc.

Figure 3:
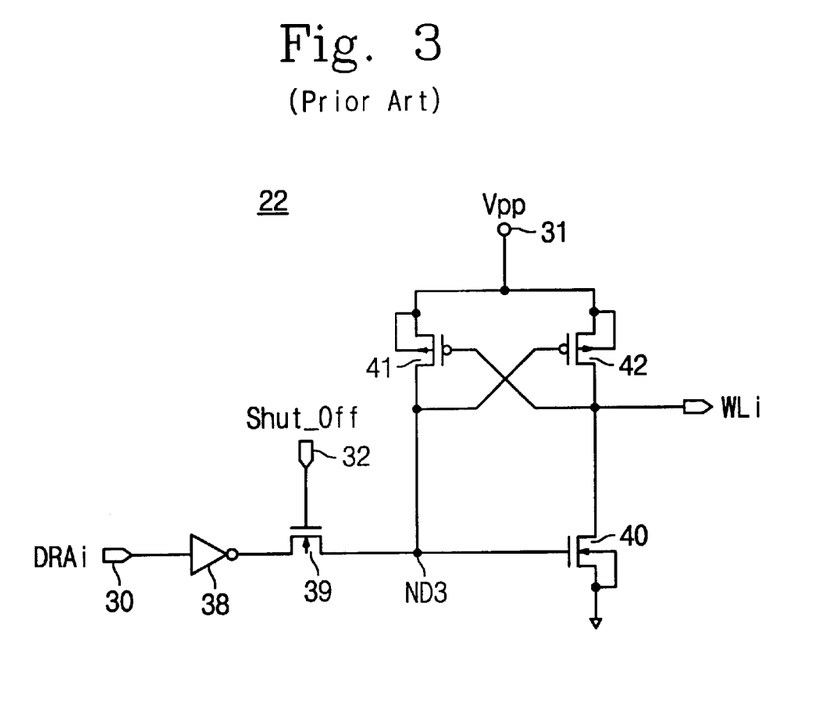
FIG. 3 shows a detailed circuit diagram of a second prior art word line driver as shown in FIG. 1.

Referring to FIG. 3, a second prior art detailed circuit diagram of a word line driver 22 is shown. In that circuit, when a selection signal DRAi is at the 'L' level and the word line voltage Vpp is at about +1 volt (or when the word line voltage Vpp is less than a power supply voltage Vcc), a node ND3 becomes the 'H' level through both an invertor 38 and an NMOS transistor 39 turned on by the shut off signal Shut_Off. A deselected word line WLi is grounded through the NMOS transistor 40, and then a PMOS transistor 41 is turned on, again shorting the node ND3 and Vpp. Therefore, the word line driver 22 in FIG. 3 has the same problem as that in FIG. 2.

SUMMARY OF THE INVENTION

It is therefore an object of the present invention to provide a nonvolatile semiconductor memory device having a word line decoder which can drive a word line with a word line voltage both higher than a power supply voltage and less than the power supply voltage.

In order to attain the above objects, according to one aspect of the present invention, there is provided a nonvolatile semiconductor memory device. The device comprises a word line, a bit line, a memory cell connected to the word line and the bit line, a word line driving circuit for driving the word line with a word line voltage supplied in accordance with each mode of operation in response to a shut off signal, and a circuit for generating the shut off signal during each mode of operation. The circuit generates the shut off signal having a power supply voltage when the word line voltage is higher than the power supply voltage, and generates the shut off signal having the word line voltage when the word line voltage is less than the power supply voltage.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENTS

It should be noted in the description to follow that a row decoder circuit 200 and a column decoder circuit 300 of a nonvolatile semiconductor memory device 1 each comprise means for generating a shut off signal Shut_Off, consisting of a comparator 240, a first driver 260, and a second driver 280. According to this configuration, the shut off signal Shut_Off has a word line voltage level when a word line voltage Vpp is less than a power supply voltage Vcc, and has the power supply voltage level when the word line voltage Vpp is higher than the power supply voltage Vcc.

Figure 4:
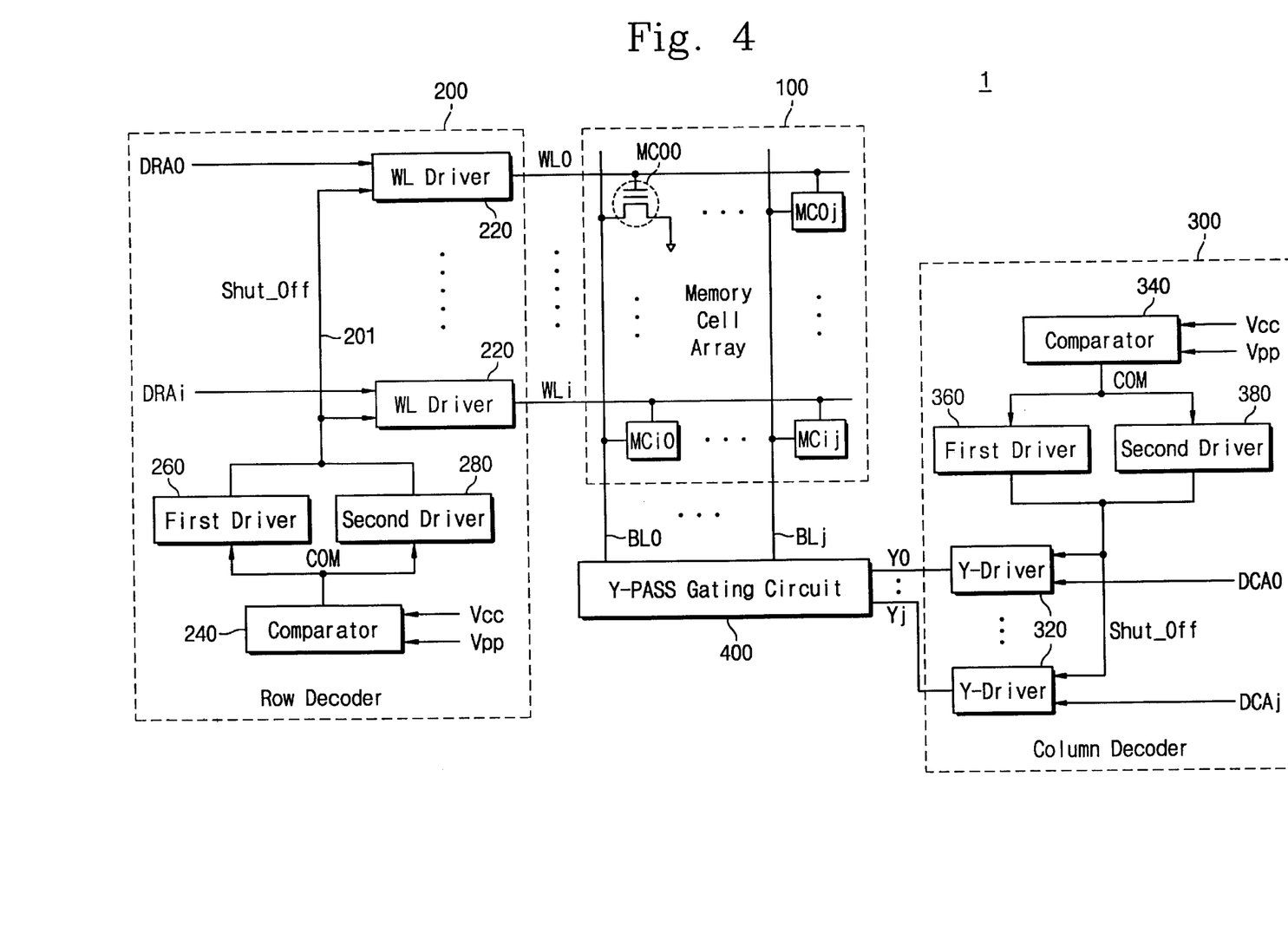
FIG. 4 shows a block diagram of a nonvolatile semiconductor memory device according to the present invention.

FIG. 4 shows a block diagram of a nonvolatile semiconductor memory device 1 according to the present invention. The device 1 comprises the same memory cell array 100 as that of FIG. 1, description thereof is thus omitted. At each word line WL0–WLi, a word line driver 220 is connected. Each word line driver 220 drives corresponding word line WLx with a word line voltage Vpp required at each mode of operation in response to a shut off signal Shut_Off when the corresponding selection signal DRAx is enabled at a 'H' level.

A comparator 240 receives the word line voltage Vpp and the power supply voltage Vcc, and then compares the two voltages Vpp and Vcc. If the Vpp voltage is higher than the Vcc voltage, the comparator 240 generates a comparison signal COM of the 'H' level, and if the Vpp voltage is less than the Vcc voltage, the comparator 240 generates the comparison signal COM with a 'L' level. A first driver 260 drives a line 201 for transferring the shut off signal Shut_Off with the word line voltage Vpp in response to the comparison signal COM, and a second driver 280 drives the line 201 with the power supply voltage Vcc in response to the comparison signal COM. A detailed circuit diagram of the comparator 240, the first and second drivers 260 and 280, and a word line driver 220 according to a first preferred embodiment of the present invention is depicted in FIG. 5.

Figure 5:
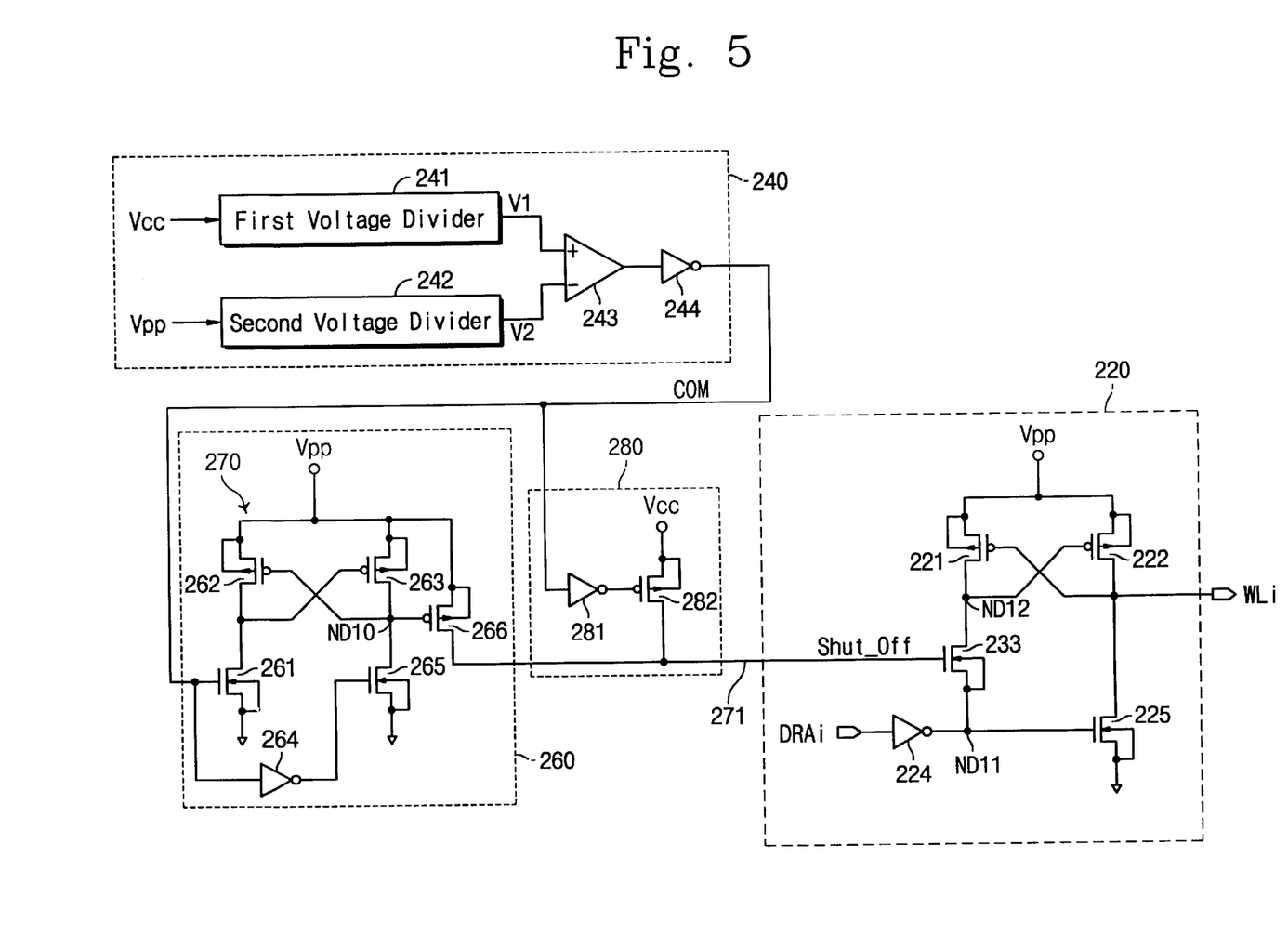
FIG. 5 shows a detailed circuit diagram of a word line driver as shown in FIG. 4 according to a first preferred embodiment of the present invention.

Referring to FIG. 5, the comparator 240 comprises a first voltage divider 241, a second voltage divider 242, a differential amplifier 243, and an invertor 244. The first voltage divider 241 divides the power supply voltage Vcc (for example, by use of resistors not shown) and the second voltage divider 242 divides the word line voltage Vpp. The differential amplifier 243 compares the outputs V1 and V2 of the first and second voltage dividers 241 and 242, and the invertor 244 receives the output of the differential amplifier 243 and outputs the comparison signal COM. As set forth above, the comparison signal COM has the 'H' level when Vpp>Vcc, and does the 'L' level when Vpp<Vcc.

The first driver 260 is comprised of a level shifter 270 and a PMOS transistor 266, wherein the level shifter 270 comprises an invertor 264, two NMOS transistors 261 and 265, and two PMOS transistors 262 and 263. The NMOS transistor 261 has a gate receiving the comparison signal COM, one current electrode grounded, and the other current electrode connected with the PMOS transistor 262 and a gate of the PMOS transistor 263. The PMOS transistor 262 has one current electrode connected to a word line voltage Vpp, the other current electrode grounded through the NMOS transistor 261, and a gate connected to a node ND10. The PMOS transistor 263, whose gate is connected to the other current electrode of the NMOS transistor 261, has one current electrode coupled to the word line voltage Vpp and the other current electrode tied to the node ND10. The NMOS transistor 265, whose gate receives the comparison signal COM through the invertor 264, has one current electrode connected to the node ND10 and the other current electrode grounded. The PMOS transistor 266 serves as a pull up transistor and has one current electrode coupled to the word line voltage Vpp and the other current electrode connected to the word line driver 220 (for outputting the shut off signal Shut_Off).

When the comparison signal COM is at the 'L' level, the node ND10 has the 'L' level through the invertor 264 and the NMOS transistor 265, enabling the PMOS transistor 266 to drive the shut off signal Shut_Off line 271 with the word line voltage Vpp. On the other hand, when the signal COM is at the 'H' level, the node ND10 has the word line voltage Vpp by the NMOS transistor 261 and the PMOS transistor 263, so that the PMOS transistor 266 is turned off.

As shown in FIG. 5, the second driver 280 is composed of an invertor 281 and one PMOS transistor 282. The PMOS transistor 282, whose gate receives the comparison signal COM through the invertor 281, has one current electrode coupled to the power supply voltage Vcc and the other current electrode connected to the shut off signal on the Shut_Off line 271. When the signal COM is at the 'L' level, the PMOS transistor 282 is turned off. When the signal COM is at the 'H' level, the PMOS transistor 282 is turned on, so that the shut off signal Shut_Off line 271 is pulled up to the power supply voltage Vcc.

The components 221–225 of the word line driver 220 according to the present invention are configured identically to those according to the prior art in FIG. 2, and consequently a description thereof is thus omitted. An operation of the word line driver 220 for the program and read modes of operation will be described below.

First, under the assumption that the power supply voltage Vcc is a voltage of about 3 volts, a read operation of a selected memory cell MC00 is described. During the read operation, the comparator 240 generates the comparison signal COM having the 'H' level, enabling the second driver 280 to drive the shut off signal Shut_Off line 271 with the power supply voltage Vcc of about +3 volts (i.e., a logical high level). The selection signal DRA0 associated with the selected memory cell MC00 is at a 'H' level and a word line voltage Vpp of about +4.5 volts may be applied to a selected word line WL0 through a word line driver 220.

Under this condition, a node ND11 has the 'L' level through the invertor 224, and a node ND12 has the 'L' level through the NMOS transistor 233 switched on by the shut off signal Shut_Off having the power supply voltage Vcc level (that is, the 'H' level). This makes the NMOS transistor 225 turned off and the PMOS transistor 222 turned on, so that the word line WL0 is pulled up to the word line voltage Vpp of about +4.5 volts through the PMOS transistor 222.

Then, during the program operation, because the word line voltage Vpp of about +10 volts is higher than the power supply voltage Vcc of about +3 volts, the comparator 240, the second driver 280, and the word line driver 220 operate in the same manner as the read operation. Description thereof is thus omitted.

As set forth above, the program/erase mode of operation is performed, and then a verification operation for the program/erase mode of operation is performed to detect whether a selected memory cell has a required threshold voltage of +6 volts to +8 volts (for example, a threshold voltage distribution of a programmed memory cell) or has a required threshold voltage of +1 volts to +3 volts (for example, a threshold voltage distribution of an erased memory cell).

During an over-erasure verification operation in which a word line voltage Vpp of about +1 volts is applied to the word line WL0, because the word line voltage Vpp is less than the power supply voltage Vcc, the comparator 240 generates the comparison signal COM having the 'L' level. This enables the first driver 260 to drive the shut off signal Shut_Off line 271 with the word line voltage Vpp of about +1 volts. At this time, the selection signal DRA0 corresponding to the word line WL0 has the 'H' level.

Under this condition, the node ND11 becomes the 'L' level through the invertor 224, and the node ND12 has the 'L' level through the NMOS transistor 233 switched on by the shut off signal Shut_Off having the word line voltage Vpp level. This makes the NMOS transistor 225 turned off and the PMOS transistor 222 turned on, so that the word line WL0 is pulled up to the word line voltage Vpp of about +1 volts through the PMOS transistor 222 thus turned on.

Simultaneously, a ground voltage is applied to deselected word lines WL1–WLi, and selection signals DRA1–DRAi associated with the deselected word lines WL1–WLi are at the 'L' level. The shut off signal Shut_Off has a level of about +1 volts as set forth above. Under this condition, the node ND11 becomes the 'H' level and then the NMOS transistor 225 is turned on. This forces each deselected word line WL1–WLi to be grounded. As a result, the PMOS transistor 221 is turned on and the node ND12 becomes the voltage Vpp of about +1 volts through the PMOS transistor 221, so that the NMOS transistor 233 is shut off (that is, the nodes ND11 and ND12 are not shorted).

Thus, as the word line voltage Vpp is not raised by the deselected word line drivers 220, the over-erasure verification operation can be performed. That is, a word line driver 220 according to the present invention transfers a word line voltage Vpp required at each mode of operation into a corresponding word line without regard to the word line voltage level. Although not shown in FIG. 5, it would be obvious to one skilled in the art that a word line driver type illustrated in FIG. 3 can be adapted in the word line driver 220 of FIG. 5.

Figure 6:
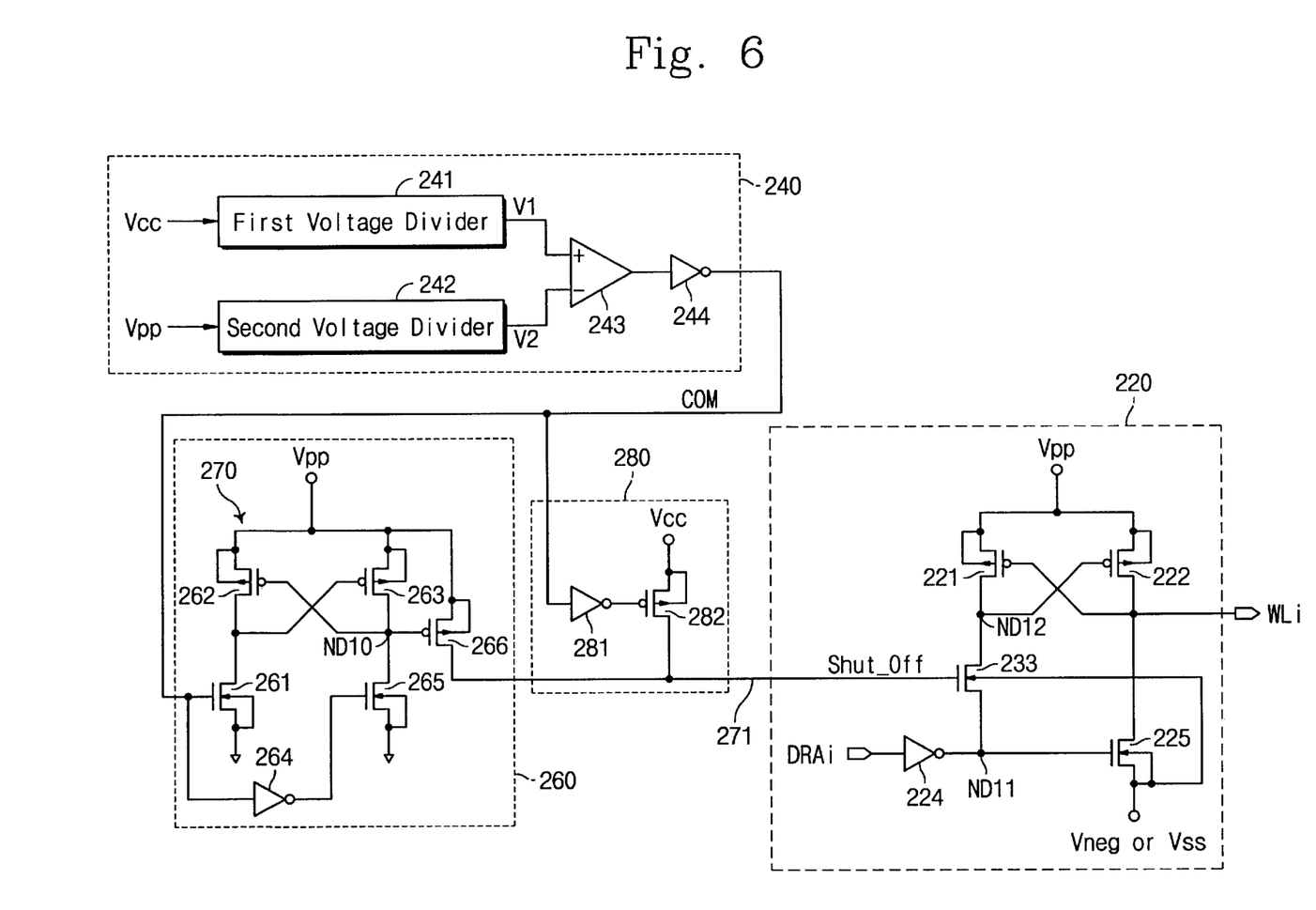
FIG. 6 shows a detailed circuit diagram of a word line driver as shown in FIG. 4 according to a second preferred embodiment of the present invention.

A detailed circuit diagram of the comparator 240, the first and second drivers 260 and 280, and a word line driver 220 according to a second preferred embodiment of the present invention is depicted in FIG. 6. FIG. 6 is similar in construction and operation to the circuit of FIG. 5, except that the bulk of the transistor 233 is connected to a ground voltage or a negative voltage Vneg (i.e., a voltage less than 0 V), not its source. In addition, in the second preferred embodiment, the bulk of the transistor 225 is also connected either to the ground voltage or the negative voltage Vneg.

Returning to FIG. 4, the nonvolatile semiconductor memory device 1 further comprises a column decoder 300 and a column pass gating circuit 400. Those elements of the decoder 300 and the circuit 400 which are the same as those in FIG. 1 are not described herein. The column decoder 300 differs from the prior art in that a comparator 340 and first and second drivers 360 and 380 are implemented therein. The circuit configuration of the comparator 340 and the first and second drivers 360 and 380 and their operation are the same as those of the row decoder 200. To avoid repetition, description thereof is omitted.

As set forth above, according to the present invention, without regard to the fact that a word line voltage Vpp required at each mode of operation is higher than the power supply voltage Vcc or is less than the power supply voltage Vcc, the word line drivers 220 each switch word line voltage Vpp required for each mode of operation to corresponding word lines WL0–WLi.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A level shifter circuit for converting an input signal having a first voltage into an output signal having a second voltage, the level shifter circuit comprising:

an input terminal for receiving the input signal;

an output terminal for outputting the output signal;

a power terminal for receiving the second voltage;

a first PMOS transistor having a first current electrode connected to the power terminal, a gate connected to the output terminal, and a second current electrode;

a second PMOS transistor having a first current electrode connected to the power terminal, a second current electrode connected to the output terminal, and a gate;

a first invertor having an input electrode connected to the input terminal and an output electrode;

a first NMOS transistor having a first current electrode connected to the second current electrode of the first PMOS transistor and the gate of the second PMOS transistor, a second current electrode connected to the output electrode of the first invertor, and a gate for receiving a shut off signal;

a second NMOS transistor having a first current electrode connected to the output terminal, a second current electrode connected to a third voltage, and a gate connected to the output electrode of the first invertor; and a circuit for generating the shut off signal, wherein the circuit generates the shut off signal having the first voltage when the second voltage is greater than the first voltage, and generates the shut off signal having the second voltage when the second voltage is less than the first voltage.

2. The level shifter circuit according to claim 1, wherein the first voltage is a power supply voltage and the second voltage is a voltage less than the first voltage.

3. The level shifter circuit according to claim 1, wherein the first voltage is a power supply voltage and the second voltage is a voltage higher than the first voltage.

4. The level shifter circuit according to claim 3, wherein the circuit comprises:

a comparator for comparing the first voltage and the second voltage to generate a comparison result as a comparison signal;

a first driver for driving the input terminal with the second voltage in response to the comparison signal; and a second driver for driving the input terminal with the first voltage in response to the comparison signal.

5. The level shifter circuit according to claim 4, wherein the comparator comprises:

a first voltage divider for dividing the first voltage;

a second voltage divider for dividing the second voltage;

a differential amplifier circuit for comparing the outputs of the first and second voltage dividers; and a second invertor for inverting an output signal of the differential amplifier circuit to output the comparison signal.

6. The level shifter circuit according to claim 5, wherein the first driver comprises:

a level shifter for converting a voltage of the comparison signal into one of the second voltage and the ground voltage; and a pull up transistor for pulling the input terminal up to the second voltage in response to the level shifter.

7. The level shifter circuit according to claim 5, wherein the second driver comprises:

a third invertor for receiving the comparison signal; and a pull up transistor for pulling the input terminal up to the first voltage in accordance with the output signal of the third invertor.

8. The level shifter circuit according to claim 1, wherein the third voltage is one of a ground voltage and a negative voltage.

* * * * *

UNITED STATES PATENT AND TRADEMARK OFFICE
CERTIFICATE OF CORRECTION

PATENT NO.   : 6,166,957
DATED        : December 26, 2000
INVENTOR(S)  : Chung et al.

It is certified that error appears in the above-identified patent and that said Letters Patent is hereby corrected as shown below:

<u>Title page,</u>
Item [62], change "Division" to -- Continuation-in-part --.

<u>Column 1,</u>
Line 5, change "divisional" to -- continuation-in-part --.

Signed and Sealed this

Twentieth Day of May, 2003

JAMES E. ROGAN
*Director of the United States Patent and Trademark Office*